(12) United States Patent
Drummond et al.

(10) Patent No.: US 11,521,821 B2
(45) Date of Patent: Dec. 6, 2022

(54) ION SOURCE REPELLER

(71) Applicant: Axcelis Technologies, Inc., Beverly, MA (US)

(72) Inventors: Steven T. Drummond, Merrimack, MA (US); Neil Colvin, Merrimack, MA (US); Paul Silverstein, Arlington, MA (US)

(73) Assignee: Axcelis Technologies, Inc., Beverly, MA (US)

(*) Notice: Subject to any disclaimer, the term of this patent is extended or adjusted under 35 U.S.C. 154(b) by 0 days.

(21) Appl. No.: 17/223,360

(22) Filed: Apr. 6, 2021

(65) Prior Publication Data
US 2022/0319796 A1 Oct. 6, 2022

(51) Int. Cl.
*H01J 37/08* (2006.01)
*H01L 21/225* (2006.01)
*H01J 37/317* (2006.01)
*H01J 27/14* (2006.01)

(52) U.S. Cl.
CPC .............. *H01J 37/08* (2013.01); *H01J 27/14* (2013.01); *H01J 37/3171* (2013.01); *H01L 21/2253* (2013.01); *H01J 2237/31701* (2013.01)

(58) Field of Classification Search
CPC ................... H01J 37/08; H01J 37/3171; H01J 2237/31701; H01J 27/14; H01J 21/2253
See application file for complete search history.

(56) References Cited

U.S. PATENT DOCUMENTS

| 5,497,006 | A | 3/1996 | Sferlazzo |
| 6,583,544 | B1 | 6/2003 | Horsky |
| 9,299,529 | B2 | 3/2016 | Tanjo |
| 10,361,069 | B2 | 7/2019 | Colvin |

*Primary Examiner* — Nicole M Ippolito
*Assistant Examiner* — Hanway Chang
(74) *Attorney, Agent, or Firm* — Eschweiler & Potashnik, LLC

(57) ABSTRACT

An ion source has an arc chamber having one or more arc chamber walls defining and interior region of the arc chamber. A cathode electrode is disposed along an axis. A repeller has a repeller shaft and a ceramic target member separated by a gap. The repeller shaft is not in electrical or mechanical contact with the target member, and the repeller shaft is configured to indirectly heat the target member. The target member, can be a cylinder encircling the repeller shaft, where the gap separates the cylinder from the repeller shaft. A top cap can enclose the cylinder can be separated from a top repeller surface of the repeller shaft by the gap. A target hole can be in the top cap. The target member can be supported by a bottom liner of the arc chamber or a support member mechanically and electrically coupled to the repeller shaft.

22 Claims, 7 Drawing Sheets

ION SOURCE REPELLER

TECHNICAL FIELD

The present invention relates generally to ion implantation systems, and more specifically to an improved repeller for an ion source to enhance etching and sputtering of a target material.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

A repeller is positioned opposite the cathode, where a target source material can be provided near the repeller, wherein ion source gases such as fluorine or other volatile species can enhance chemical etching of the target material.

SUMMARY

The present disclosure thus provides a system and apparatus for increasing the efficiency and lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided, comprising an arc chamber having a body defining and interior region of the arc chamber. A cathode electrode and a repeller are disposed along an axis, wherein the repeller comprises a repeller shaft and a target member separated by a gap. The gap, for example, separates the repeller shaft and target member by approximately 1 mm. The repeller shaft is not in electrical or mechanical contact with the target member, and is configured to indirectly heat the target member. The target member, for example, is comprised of a ceramic material and takes the form of a cylinder generally encircling the repeller shaft, wherein the gap mechanically and electrically separates the cylinder from the repeller shaft. In one example, the ceramic comprises one of aluminum nitride, aluminum oxide, and aluminum carbide.

The cylinder, for example, comprises a top target surface, and the repeller shaft comprises a top repeller surface, wherein the top target surface and top repeller surface generally face the cathode electrode, and wherein the top target surface is generally co-planar with the top repeller surface.

The target member, for example, can comprise a top cap generally enclosing the cylinder proximate to a top repeller surface of the repeller shaft. One or more target holes are further defined in top cap, wherein the top cap is further separated by the gap. At least one of the one or more target holes, for example, is centered along the axis.

In another example, a support member is mechanically and electrically coupled to the repeller shaft. The arc chamber can comprise a bottom liner, and in one example, a first end of the target member is operably coupled the bottom liner. In another example, the target member comprises a thermal break feature proximate to the lower liner, wherein the thermal break feature is configured to minimize one or more of thermal conduction and thermal radiation from the target member to the bottom liner. The thermal break, for example, comprises one of a chamfer, channel, or groove defined in an external sidewall of the target member. In another example, the thermal break feature is configured to increase an electrical tracking length associated with a surface of the target member.

According to another example, a first end of the target member is mechanically coupled to the support member. The support member, for example, is electrically biased to a potential of the cathode electrode, or can be electrically floating. In another example, an etchant gas source is provided and configured to provide an etchant gas to the interior region of the arc chamber, as well as to the gap between the target member and repeller shaft.

In accordance with another example, an ion source is provided having an arc chamber with a body defining and interior region of the arc chamber. A liner is operably coupled to the body of the arc chamber, and a cathode is disposed along an axis. A repeller comprising a repeller shaft and a ceramic target member are provided, wherein the repeller shaft and ceramic target are separated by a gap. The ceramic target member, for example, is operably coupled to the liner, wherein the repeller shaft and target member are not directly coupled to one another. The ceramic target member, for example, comprises a cylinder generally encircling the repeller shaft that is electrically separated from the repeller shaft by the gap. In another example, the ceramic target member comprises a top cap generally enclosing the cylinder proximate to a top repeller surface of the repeller shaft, wherein one or more target holes are defined in top cap, and wherein the top cap is further separated by the gap.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
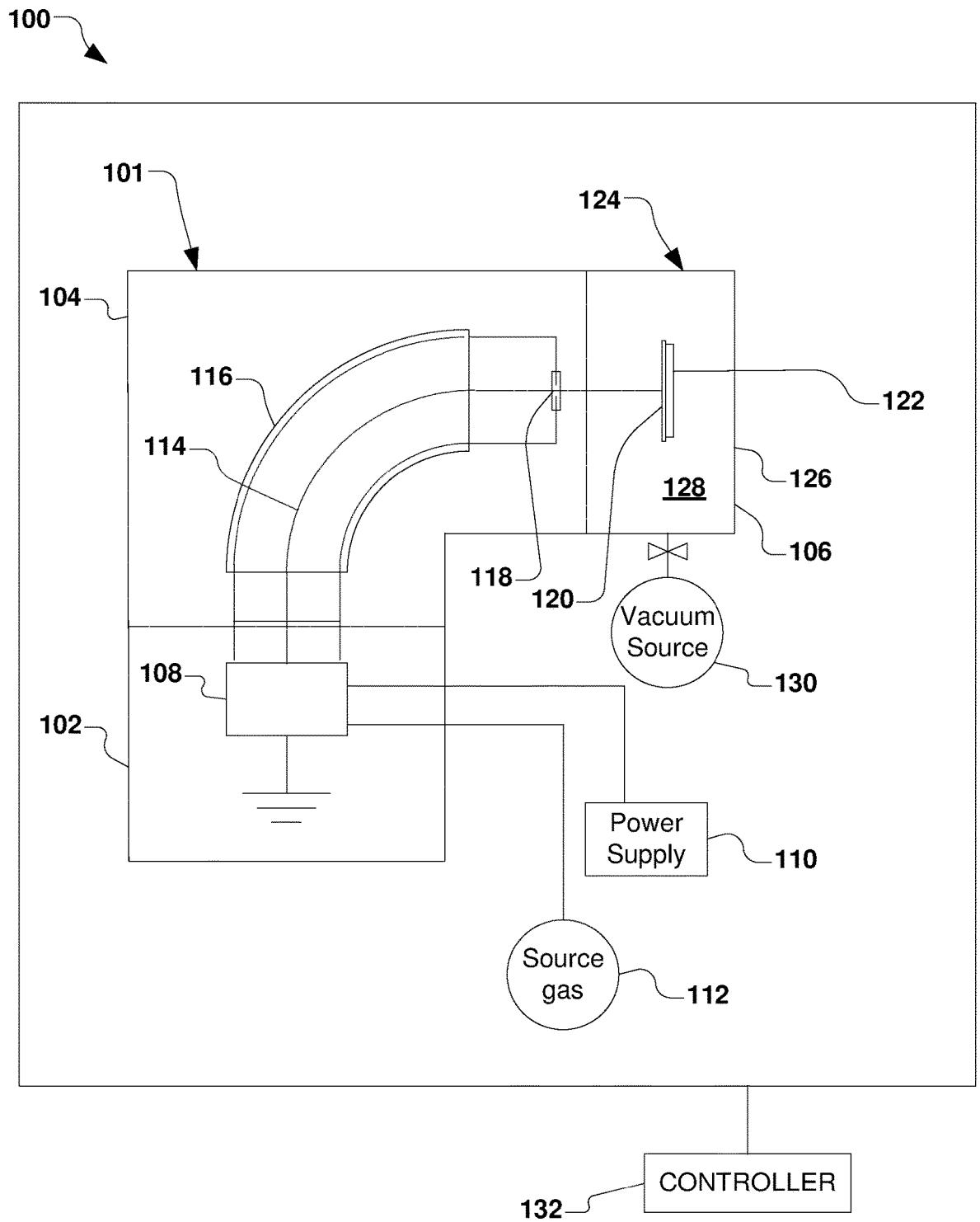
FIG. 1 is a block diagram of an exemplary vacuum system utilizing an ion source in accordance with several aspects of the present disclosure.

The present disclosure is directed generally toward an ion implantation system and an ion source associated therewith. More particularly, the present disclosure is directed toward an improved arc chamber and components associated therewith for said ion source, whereby productivity of the ion source is improved.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, elements or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

In order to gain an appreciation of the present disclosure, FIG. 1 illustrates an exemplified vacuum system 100 that may implement various apparatus, systems, and methods of the present disclosure. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a gas from a gas source 112 (also called a dopant gas) supplied thereto is ionized into a plurality of ions to form an ion beam 114. The ion beam 114 in the present example is directed through a beam-steering apparatus 116, and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 within the process chamber 124, for example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides an apparatus configured to increase beam current and utilization of the ion source 108 while decreasing downtime of the ion source in the ion implantation system 101 discussed above. It shall be understood that the apparatus of the present disclosure may be implemented in various semiconductor processing equipment such as CVD, PVD, MOCVD, etching equipment, and various other semiconductor processing equipment, and all such implementations are contemplated as falling within the scope of the present disclosure. The apparatus of the present disclosure further advantageously increases the length of usage of the ion source 108 between preventive maintenance cycles, and thus increases overall productivity and lifetime of the vacuum system 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. The gas from the gas source 112 is used within the ion source 108, wherein source gas may or may not be conductive in nature. However, once the gas is cracked or fragmented, the ionized gas can aid in chemical etching of a target material used for implantation, such as aluminum nitride (AlN) that is utilized for aluminum implants. The ion source 108, for example, plays a large role in the ion implantation system 101.

Figure 2:
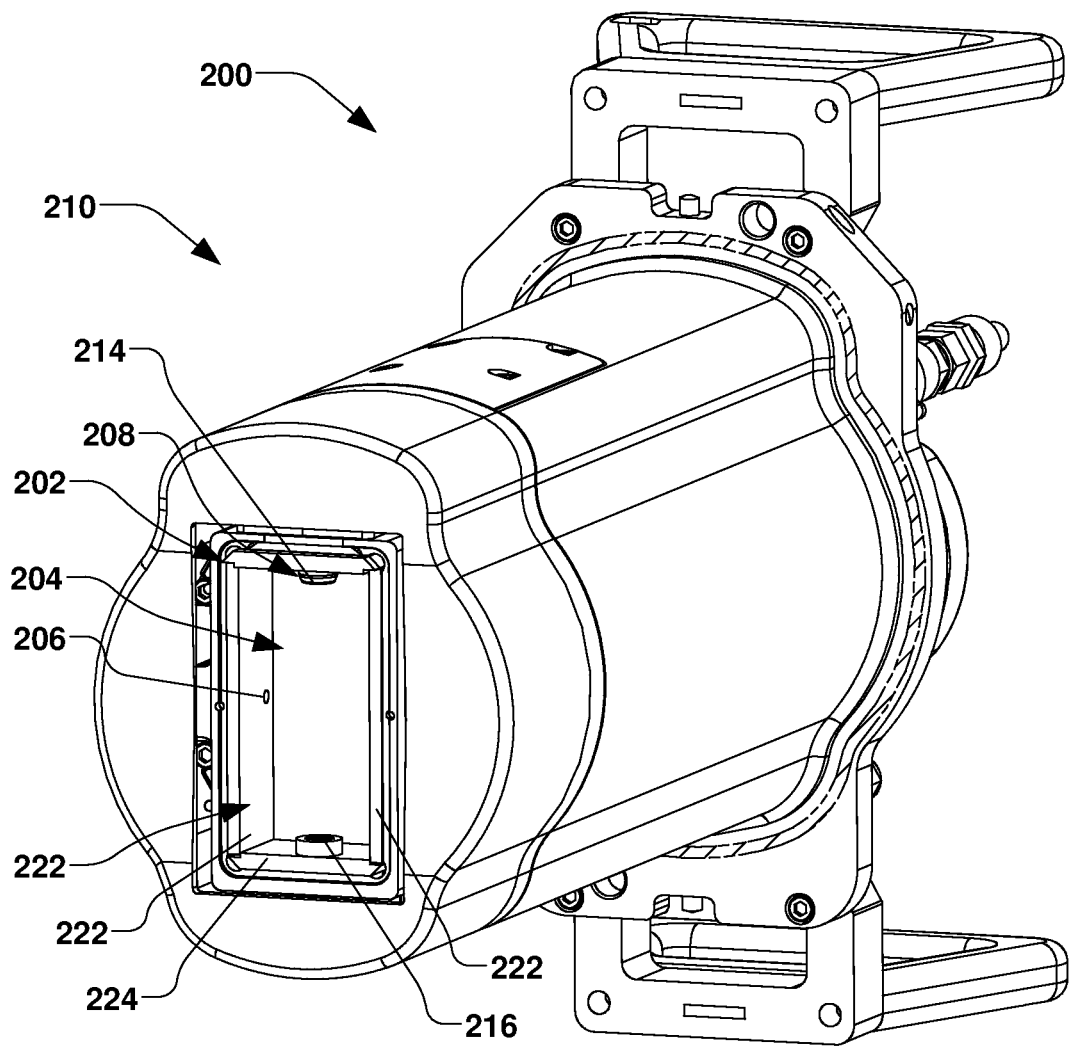
FIG. 2 illustrates a perspective view of an ion source in accordance with various example aspects of the present disclosure.

In accordance with various example aspects of the disclosure, an ion source 200 is illustrated in FIG. 2, wherein various aspects of the disclosure will be appreciated. The ion source 200 of FIG. 2 comprises an arc chamber 202 configured for forming an ion beam (not shown). The ion source 200, for example, generates the ion beam by ionizing a source gas introduced to an internal volume 204 of the arc chamber 202 through a source gas inlet 206. The source gas inlet 206, for example can be fluidly coupled to the gas source 112 of FIG. 1 for introduction of the source gas to the internal volume 204 of the arc chamber 202 of FIG. 2. The ionization process and formation of a plasma (not shown) within the internal volume 204, for example, is effectuated by an exciter 208 shown in FIG. 2, which may take the form of a thermally heated filament, a filament heating a cathode (indirectly heated cathode "IHC"), or a radio frequency (RF) antenna. In accordance with the present disclosure, the arc chamber 202 of the ion source 200 of the present example is associated with an IHC ion source 210, as illustrated in greater detail in FIG. 3.

The IHC ion source 210, for example, comprises a filament 212, an indirectly heated cathode 214 and a repeller 216 (e.g., an anti-cathode) that are positioned opposite of one another generally along an axis 218 in the arc chamber 202. An aperture 220 is further provided, through which the ion beam 114 of FIG. 1 emerges. In one example, a source magnet (not illustrated) can provide a magnetic field (not shown) generally along the axis 218 of FIG. 3 between the cathode 214 and repeller 216. During operation of an IHC ion source 210, for example, the filament 212 is resistively heated to temperatures high enough to emit electrons, which are in turn accelerated to bombard the indirectly heated cathode 214 that is maintained at a potential that is positive with respect to the filament.

The indirectly heated cathode 214, for example, is heated to temperatures high enough for it to thermally emit electrons into the arc chamber 202, which is held at a potential that is positive with respect to the cathode in order to accelerate the electrons. The magnetic field helps confine the electrons along field lines between the indirectly heated cathode 214 and repeller 216 in order to reduce the loss of electrons to one or more liners 222 of the arc chamber 202. The loss of electrons is further reduced by the repeller 216, which can be held at the potential of the indirectly heated cathode 214 in order to reflect electrons back toward the cathode. The excited electrons ionize the source gas, thus generating a plasma (not shown). Ions are thus extracted through the aperture 220 and electrostatically accelerated to form a high energy ion beam by an electrode positioned outside the arc chamber 202.

In operation, the indirectly heated cathode 214 (e.g., a cathode composed of tungsten or tantalum) is indirectly heated via the filament 212 and is used to start and sustain the ion source plasma (e.g., a thermionic electron emission). The indirectly heated cathode 214 and the repeller 216, for example, are at a negative potential in relation to the one or more liners 222 (e.g., tungsten liners) of the arc chamber 202, and both the cathode and repeller can be sputtered by the ionized gases.

Figure 3:
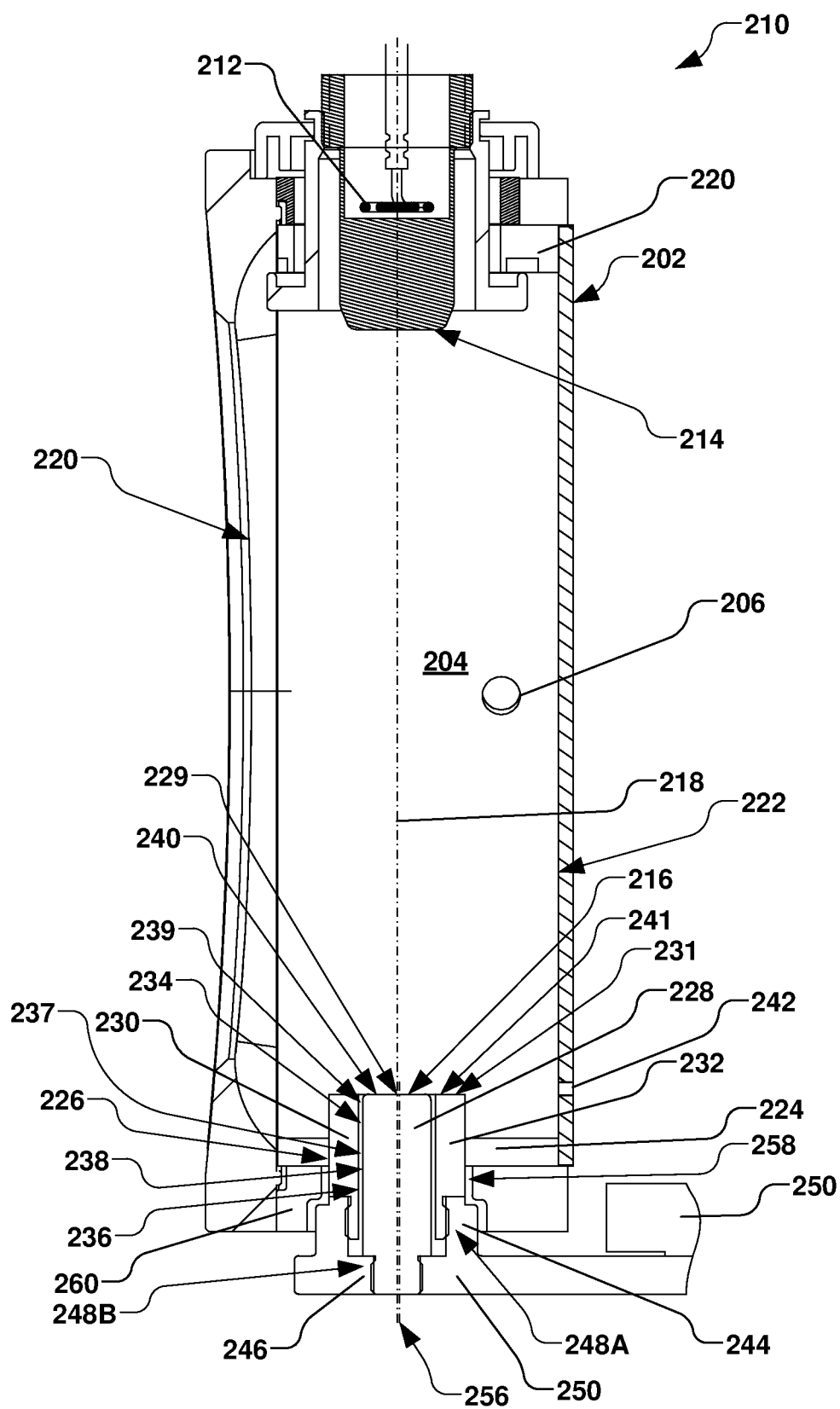
FIG. 3 illustrates a cross-sectional view of an arc chamber of the ion source of FIG. 2. in accordance with various example aspects of the present disclosure.
Figure 4:
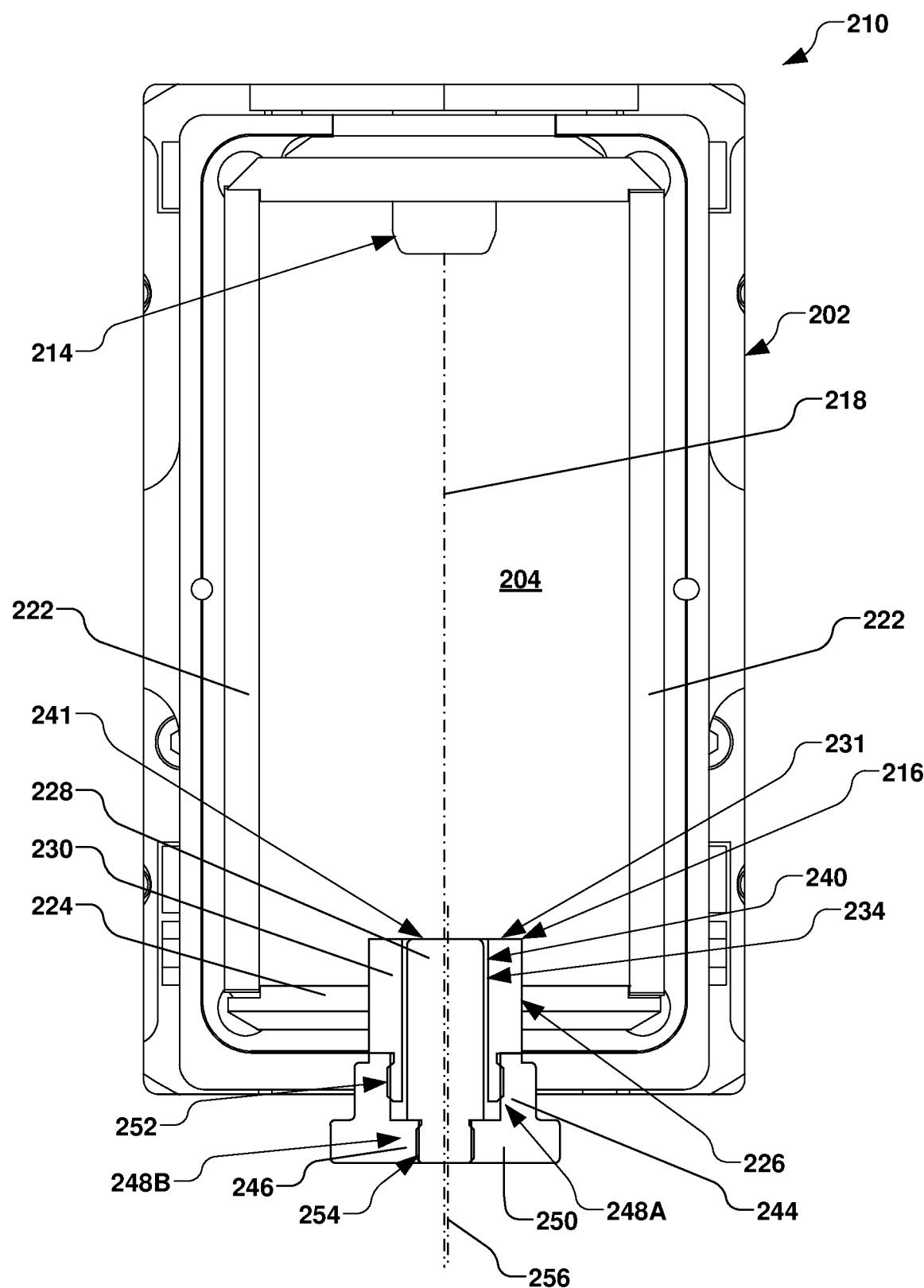
FIG. 4 illustrates a partial cross-sectional view of an arc chamber in accordance with various example aspects of the present disclosure.

FIGS. 3-4 further illustrate a bottom liner 224 that is provided in the IHC ion source 210 of FIG. 2, whereby the bottom liner comprises a hole 226 and wherein the hole is configured to permit a repeller shaft 228 of the repeller 216 to pass therethrough. It should be noted that while the term "bottom" is presently used in reference to the bottom liner 224, the bottom liner need not be positioned at a lower-most position of the arc chamber 202. The repeller shaft 228, for example, can be constructed from one or more of tungsten, tantalum, molybdenum, or graphite. In the present example, a top repeller portion 229 of the repeller shaft 228 is exposed to the plasma within the internal volume and is coaxially aligned with the indirectly heated cathode 214 along the axis 218.

In accordance with one example aspect of the present disclosure, a target member 230 is provided proximate to the repeller shaft 228, whereby the target member, for example, is generally cylindrical and generally encircles the repeller shaft 228, whereby a top target surface 231 of the target member is generally exposed to the plasma within the internal volume 204 of the arc chamber 202. The top target surface 231, for example, comprises the surface of the target member 230 that generally faces the indirectly heated cathode 214. The target member 230, for example, is comprised of a target material 232 that is configured to be chemically etched and sputtered by the ion source plasma. In one example, the target material is a ceramic comprising a metal (e.g., aluminum nitride, aluminum oxide, or aluminum carbide). The metal, for example, has a melting temperature of greater than 400 C. It should be noted that while the present example describes the target material 232 in one example as being an aluminum-based ceramic, the present disclosure further contemplates the target material 232 being any high temperature ceramic containing a metal other than aluminum. In yet another example, the target material is comprised of a metal having a melting temperature of greater than 400 C.

In one example, the target member 230 is secured, fastened, or otherwise operably coupled to the bottom liner 224, wherein the bottom liner is at a return or ground potential. The target member 230, for example, is further configured to provide a gap 234 between an interior surface 236 of the target member and a repeller surface 238 of the repeller shaft 228. The gap 234, being between the target member 230 and repeller shaft 228, further generally defines an annular gap 239 that radially surrounds the repeller shaft. The gap 234, for example, is approximately 0.25 mm or greater. As such, the target member 230 and repeller shaft 228 do not physically contact one another. In the present example, the top target surface 231 of the target member 230 is approximately co-planar with a top repeller surface 240 of the repeller shaft 228. While not shown, in other examples, the top target surface 231 of the target member 230 may be slightly higher or lower than the top repeller surface 240 of the repeller shaft 228 by a small margin (e.g., approximately 1 mm) associated with the gap 234.

The gap 234 between the target member 230 (e.g., a ceramic cylinder) and repeller shaft 228, for example, generally defines a gas region 237, wherein the source gas or another gas provided from a secondary gas inlet 242 proximate to the target member is permitted to flow between the repeller shaft and target member, thereby enhancing the chemical etching of the target material. The gap 234, in one example, can be approximately 1 mm, thereby providing significant gas conductance within the gap. For example, the gas region 237 between the target member 230 and repeller shaft 228 further exposes the interior surface 236 of the target material to further enhance the chemical etching and sputtering of the target material 232.

The present disclosure appreciates the gap 234, being substantially small, advantageously places the target member 230 in close proximity to the repeller shaft 228, whereby an efficiency of etching of the target member is increased due to heat generated from the repeller shaft subsequently heating the target member and aiding chemical decomposition of the target material via the gas provided within the gap. The present disclosure further advantageously provides more surface area for etching and sputtering, whereby both the interior surface 236 and top repeller portion 241 of the target member 230 can be exposed to both etching and sputtering processes associated with the plasma within the arc chamber 202.

In one example, the target member 230 is comprised of an aluminum-containing ceramic (e.g., AlN and AlO), whereby a fluorinated gas (e.g., $BF_3$, $SiF_4$, or $PF_3$) is injected into the arc chamber 202 via one or more of the source gas inlet 206 and secondary gas inlet 242. The fluorinated gas, for example, is cracked in the plasma during operation of the arc chamber to yield fluorine, whereby the fluorine etches the aluminum from target member 230. The fluorinated gas (e.g., a dopant gas or a mixture of an inert gas and fluorine gas) is thus further channeled to the gap 234 between the repeller shaft 228 and the target member 230.

Furthermore, in accordance with another example aspect, the target member 230 is operably coupled to a target support 244, wherein the target support is configured to support the target member while providing no direct contact between the target member and the repeller shaft 228. Likewise, the repeller shaft 228 is operably coupled to a repeller shaft support 246, whereby the repeller shaft support further provides no direct contact between the repeller shaft and the target member 230.

Figure 5:
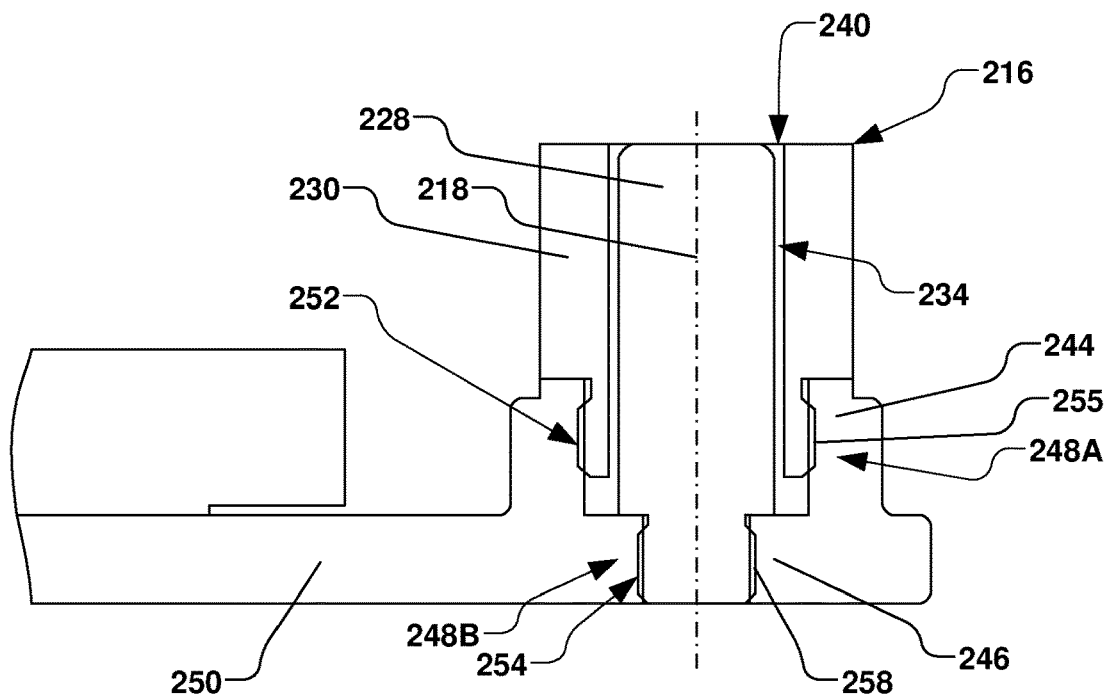
FIG. 5 illustrates a cross-sectional view of a repeller assembly in accordance with several examples of the present disclosure.

In one example illustrated in FIGS. 3-5, for example, the target support 244 and repeller shaft support 246 are defined in different regions 248A, 248B of a support member 250. The support member 250, for example, can be at an electrical potential of the indirectly heated cathode 214 or electrically biased to the indirectly heated cathode, and can be electrically insulated from other components via an insulative member.

The target member 230, for example, is selectively fastened (e.g., threaded, press-fit, or otherwise mechanically fastened) to the target support 244 via one or more first fasteners 252, and the repeller shaft 228 is selectively fastened (e.g., threaded, press-fit, or otherwise mechanically fastened) to the repeller shaft support 246 via one or more second fasteners 254. As illustrated in the example shown in FIG. 5, the one or more first fasteners 252 comprise a first threaded engagement 255 of the target member 230 and target support 244, while the one or more second fasteners 254 comprise a second threaded engagement 258 of the repeller shaft 228 and repeller shaft support 246. Further, the support member 250, for example, is electrically coupled to the repeller shaft 228 via the one or more second fasteners 254.

The target support 244 and repeller shaft support 246, for example, are further configured to control a repeller position 256 (e.g., one or more of an axial position and radial position of the repeller 216) with respect to the axis 218. For example, an arrangement of one or more of the target support 244 and repeller shaft support 246 with respect to one or more of the repeller shaft 228, the target member 230, and the arc chamber 202 can determine the repeller position 256, in one or more an axial and radial direction with respect to the axis 218. Thus, the repeller position 256 can be controlled to be either coaxial with the axis 218 or have other off-center configurations (as shown in FIG. 5). For example, the repeller position 256 can be configured such that the indirectly heated cathode 214 can be co-axial or off-center relative to one or more of the target member 230 or repeller shaft 228. A spacing between a bottom wall 260 of the arc chamber 202 and the repeller 216, for example, can provide for modification of the repeller position 256 of the repeller with respect to the arc chamber.

Figure 6:
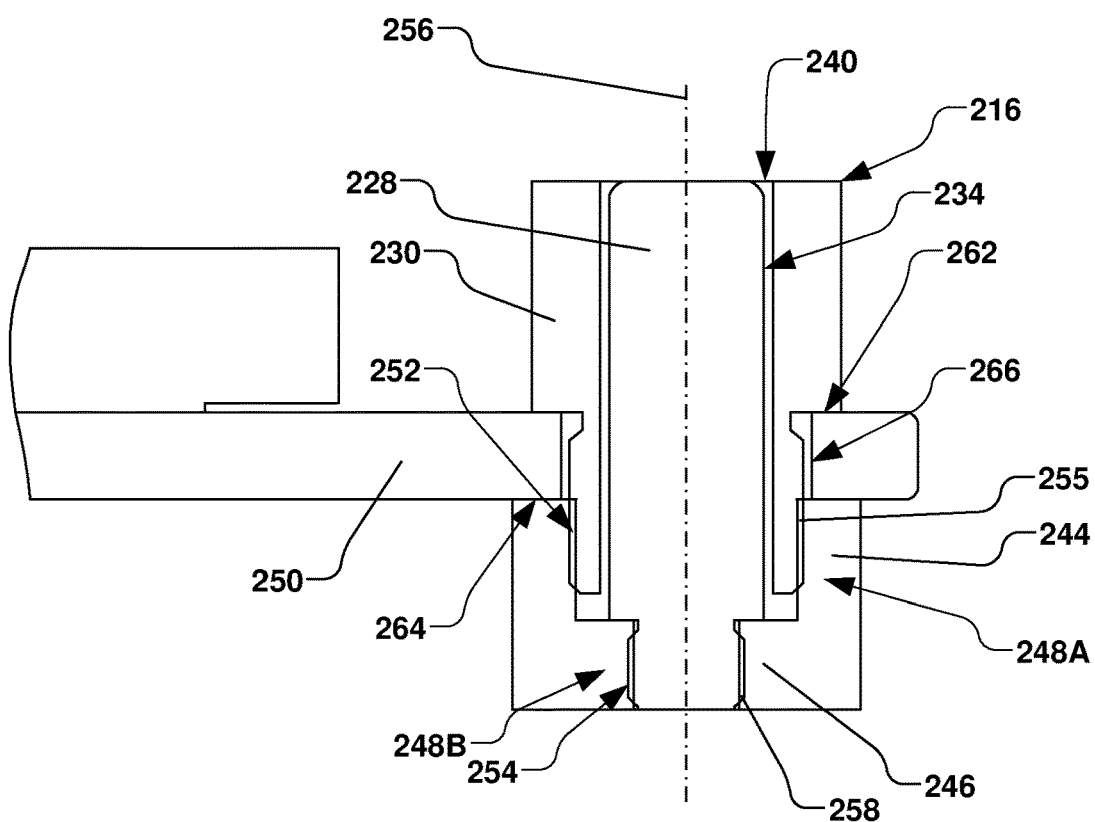
FIG. 6 illustrates a cross-sectional view of another repeller assembly in accordance with several examples of the present disclosure.

In another example, as illustrated in FIG. 6, the repeller position 256 with respect to the support member 250 can be controlled via a mechanical coupling between the target support 244, target member 230, and the support member 250. For example, the support member 250 is clamped between a collar 262 of the target member 230 and an end portion 264 of the region 248A of the target support 244. The end portion 264, for example, provides and electrical contact between the target support 244 and the support member 250. Further, in the present example, the mechanical coupling between the target support 244, target member 230, and support member 250, in conjunction with a pass-through hole 266 in the support member further allows for controlling the repeller position 256.

Figure 7:
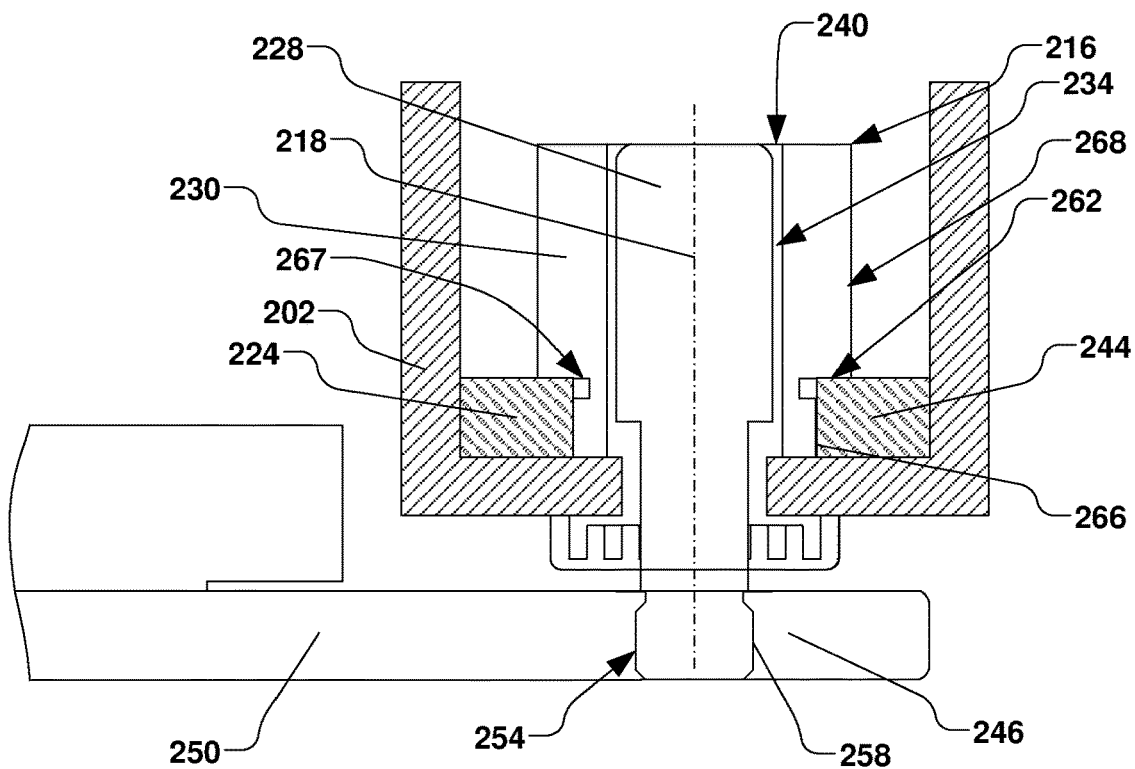
FIG. 7 illustrates a cross-sectional view of a bottom portion of an arc chamber for an exemplary ion source in accordance with several examples of the present disclosure.
Figure 8:
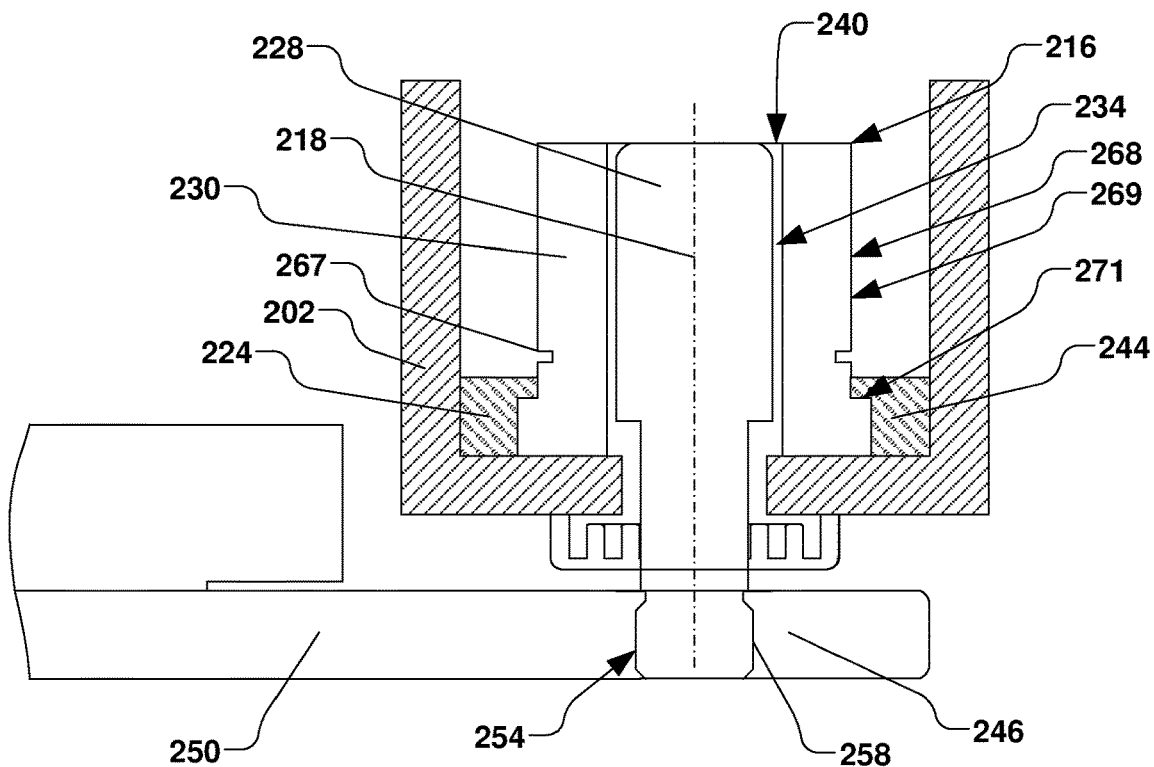
FIG. 8 illustrates a cross-sectional view of a bottom portion of an arc chamber for an exemplary ion source in accordance with several further examples of the present disclosure.

According to another example, FIGS. 7-8 illustrate one or more thermal breaks 267 (e.g., a chamfer, channel, or groove) provided in the target member 230, wherein thermal conduction through the target member to the bottom liner 224 is minimized. The one or more thermal breaks 267, for example, can also be utilized to increase an electrical tracking length to an electrical ground when various species of gas (e.g., $PH_3$) potentially coat a surface 268 of the target member 230 with a conductive coating (e.g., a phosphorus coating—not shown). The one or more thermal breaks 267, for example, can be machined into an external sidewall 269 of the target member 230 to reduce thermal conduction to the mounting surface (e.g., the bottom liner 224).

In another example illustrated in FIG. 8, the target member 230 comprises a flange 271 configured to engage the bottom liner 224, wherein the bottom liner mechanically secures and aligns the target member. FIG. 8 further illustrates another example thermal break 267 provided in the target member 230 proximate to the bottom liner 224. It should be noted that any number of thermal breaks 267 can be provided in the target member 230 for limiting thermal conduction/radiation and/or electrical conduction along the target member.

In accordance with another aspect, the repeller shaft 228 of FIG. 3, for example, is comprised of a conductive refractory metal (e.g., tungsten), while the target member 230 is generally non-conductive or insulative (e.g., a ceramic) that is electrically biased or floating (e.g., charged to predetermined potential). In the examples described above, a top repeller portion 229 of the repeller shaft 228 is exposed to the environment of the internal volume 204. The repeller shaft 228, being negative biased, generates a negative field, such that a voltage applied to the repeller shaft accelerates positive charged ions in proximity thereto. As such, a voltage drop (called a sheath), accelerates the ions. The greater the bias applied to the repeller shaft 228, the greater the energy in the acceleration that is achieved. Thus, the repeller shaft 228 increases ion generation efficiency.

Figure 9:
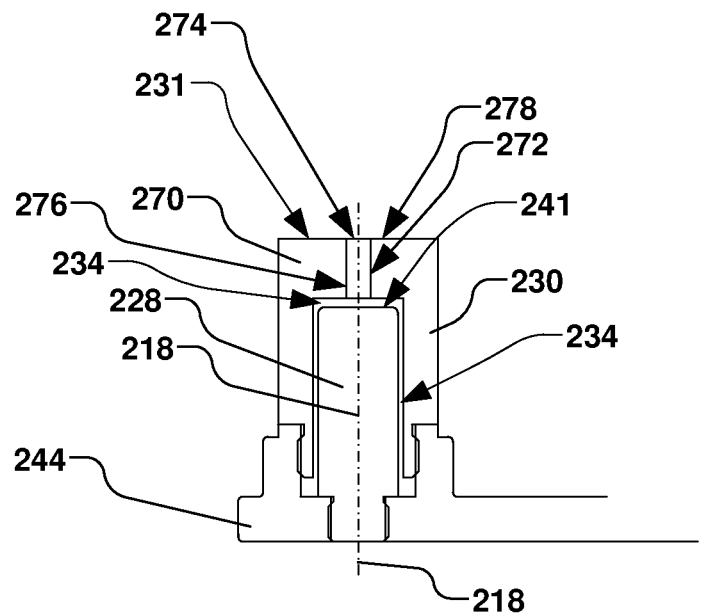
FIG. 9 illustrates a cross-sectional view of another repeller assembly in accordance with several examples of the present disclosure.

In the example illustrated in FIG. 9 a top cap 270 of the target member 230 generally covers the top repeller portion 241 of the repeller shaft 228, while a target hole 272 is further provided in a center portion 274 of the target member. As such, the repeller shaft 228 can be utilized to generate ions through the target hole 272, while still allowing the source gas to enter for further etching and sputtering of the target material associated with the top target surface 231 of the target member 230. As such, the top target surface 231 of the target member 230 is raised from the top repeller portion 241 of the repeller shaft 228, while still maintaining the gap 234 between the repeller shaft and the target member. The target hole 272, for example, permits the electric field generated from the repeller shaft 228 to penetrate through the target member 230, thus further providing increased etch rates.

Figure 10:
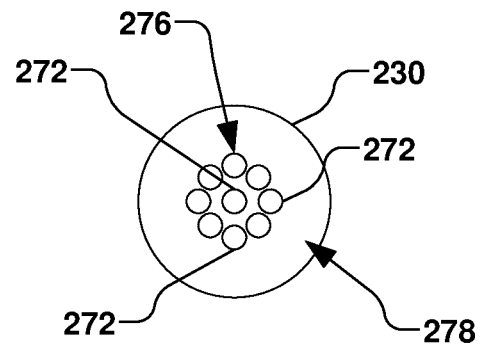
FIG. 10 illustrates a plan view of a target member in accordance with various examples of the present disclosure.

FIG. 10 illustrates another example, wherein the top cap 270 comprises a plurality of target holes 272. The plurality of target holes 272, for example, are configured to further provide sputtering and etching of the target material of the target member 230 while further providing additional conductance of the source gas therethrough.

It is to be appreciated that a surface area 276 of the target member 230 can be increased by providing the plurality of target holes 272, whereby a greater degree of exposure of a surface 278 of the target member to the plasma can increase the rate of etching or sputtering of the target material. As such, the ion beam current can be further advantageously increased. The target member 230, for example, can generally cover the repeller shaft 228, while at least one of the plurality of target holes 272 is aligned with the axis 218 of FIG. 9 and has a diameter that is large enough to permit the electric field generated by the repeller shaft to extend past the surface 278 of the target member.

Further, while not shown, due to the electrically insulative properties of the target member 230, a bias plate may be further provided in the arc chamber 202 of FIG. 3, wherein the bias plate is configured to further permit an electric field to permeate the plurality of target holes 272 provided in the top cap 270.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source, comprising:
   an arc chamber having a body defining and interior region of the arc chamber;
   a cathode electrode disposed along an axis; and
   a repeller comprising a repeller shaft and a target member separated by a gap, wherein the repeller shaft is not in electrical or mechanical contact with the target member, and wherein the repeller shaft is configured to indirectly heat the target member.

2. The ion source of claim 1, wherein the target member comprises a cylinder generally encircling the repeller shaft, and wherein the gap mechanically and electrically separates the cylinder from the repeller shaft.

3. The ion source of claim 2, wherein the cylinder comprises a top target surface facing the cathode electrode, and wherein the repeller shaft comprises a top repeller surface facing the cathode electrode, wherein the top target surface is generally co-planar with the top repeller surface.

4. The ion source of claim 2, wherein the target member comprises a top cap generally enclosing the cylinder proximate to a top repeller surface of the repeller shaft, wherein one or more target holes are defined in top cap, and wherein the top cap is further separated by the gap.

5. The ion source of claim 4, wherein at least one of the one or more target holes is centered along the axis.

6. The ion source of claim 1, wherein the target member is comprised of a ceramic containing a metal.

7. The ion source of claim 6, wherein the ceramic comprises a metal alloy having a melting temperature of greater than approximately 400 C.

8. The ion source of claim 1, wherein the target member is comprised of a metal.

9. The ion source of claim 8, wherein the metal has a melting temperature of greater than 400 C.

10. The ion source of claim 1, wherein the gap is approximately 1 mm.

11. The ion source of claim 1, further comprising a support member mechanically and electrically coupled to the repeller shaft.

12. The ion source of claim 11, wherein the arc chamber comprises a bottom liner, and wherein a first end of the target member is operably coupled the bottom liner.

13. The ion source of claim 12, wherein the target member comprises a thermal break feature proximate to the bottom liner, and wherein the thermal break feature is configured to minimize one or more of thermal conduction and thermal radiation from the target member to the bottom liner.

14. The ion source of claim 13, wherein the thermal break comprises one of a chamfer, a channel, or a groove defined in an external sidewall of the target member.

15. The ion source of claim 13, wherein the thermal break feature is configured to increase an electrical tracking length associated with a surface of the target member.

16. The ion source of claim 11, wherein a first end of the target member is mechanically coupled to the support member.

17. The ion source of claim 11, wherein the support member is electrically biased to a potential of the cathode electrode.

18. The ion source of claim 11, wherein the support member is electrically floating with respect to a potential of the cathode electrode.

19. The ion source of claim 1, further comprising an etchant gas source configured to provide an etchant gas to the interior region of the arc chamber and to the gap between the target member and the repeller shaft.

20. An ion source, comprising:
an arc chamber having a body defining and interior region of the arc chamber;
a liner operably coupled to the body of the arc chamber;
a cathode disposed along an axis; and
a repeller, wherein the repeller comprises a repeller shaft and a ceramic target member separated by a gap, wherein the ceramic target member is operably coupled to the liner, and wherein the repeller shaft and target member are not directly coupled to one another.

21. The ion source of claim 20, wherein the ceramic target member comprises a cylinder generally encircling the repeller shaft that is electrically separated from the repeller shaft by the gap.

22. The ion source of claim 21, wherein the ceramic target member comprises a top cap generally enclosing the cylinder proximate to a top repeller surface of the repeller shaft, wherein one or more target holes are defined in top cap, and wherein the top cap is further separated by the gap.

* * * * *